United States Patent
Cho et al.

(10) Patent No.: US 8,045,139 B2
(45) Date of Patent: Oct. 25, 2011

(54) EXPOSURE APPARATUS CAPABLE OF ASYMMETRICALLY ADJUSTING LIGHT INTENSITY

(75) Inventors: Byeong Ho Cho, Icheon-si (KR); Dong Sook Chang, Icheon-si (KR)

(73) Assignee: Hynix Semiconductor Inc., Icheon-si (KR)

( * ) Notice: Subject to any disclaimer, the term of this patent is extended or adjusted under 35 U.S.C. 154(b) by 740 days.

(21) Appl. No.: 11/955,646

(22) Filed: Dec. 13, 2007

(65) Prior Publication Data

US 2009/0002657 A1     Jan. 1, 2009

(30) Foreign Application Priority Data

Jun. 27, 2007 (KR) .................. 10-2007-0063924

(51) Int. Cl.
G03B 27/54 (2006.01)
G03B 27/72 (2006.01)

(52) U.S. Cl. ............................. 355/71; 355/67

(58) Field of Classification Search .............. 355/52–53, 355/55, 67–68, 71; 430/5, 30
See application file for complete search history.

(56) References Cited

U.S. PATENT DOCUMENTS

| | | | |
|---|---|---|---|
| 7,262,831 B2 | 8/2007 | Akhssay et al. | |
| 7,275,408 B1 | 10/2007 | Balasubramaniam et al. | |
| 2004/0174512 A1* | 9/2004 | Toyoda et al. | 355/67 |
| 2005/0062949 A1* | 3/2005 | Irie | 355/53 |
| 2009/0323043 A1* | 12/2009 | Dieckmann et al. | 355/71 |

FOREIGN PATENT DOCUMENTS

KR   10-2001-0090252   10/2001
KR   10-2006-0086496   8/2006

OTHER PUBLICATIONS

Van Schoot et al, "CD Uniformity Improvement by Active Scanner Corrections". Proceedings of SPIE, vol. 4691, p. 304-314.*
Van Schoot et al: Etch, Reticle, and Track CD Fingerprint Corrections with Local Dose Compensation; Proceedings of SPIE vol. 5755, pp. 107-118.*

* cited by examiner

*Primary Examiner* — Hung Henry Nguyen
*Assistant Examiner* — Colin Kreutzer
(74) *Attorney, Agent, or Firm* — Marshall, Gerstein & Borun LLP

(57) ABSTRACT

An exposure apparatus of a semiconductor device may include an exposure light source; an asymmetric adjustment filter for asymmetrically adjusting intensity of a light which passes through the exposure light source; a photomask for passing the light of which intensity is adjusted by the asymmetric adjustment filter; a projection lens for projecting the light passing through the photomask; and a wafer stage for mounting a wafer on which an image is formed by the light from the projection lens.

20 Claims, 5 Drawing Sheets

EXPOSURE APPARATUS CAPABLE OF ASYMMETRICALLY ADJUSTING LIGHT INTENSITY

CROSS-REFERENCES TO RELATED APPLICATION

Priority to Korean patent application number 10-2007-0063924, filed on Jun. 27, 2007, the disclosure of which is incorporated by reference in its entirety, is claimed.

BACKGROUND OF THE INVENTION

The present invention relates to a semiconductor device and, more particularly, to an exposure apparatus.

A photolithography process uses a photomask with different patters to form patterns on a wafer. The photolithography process projects the patterns formed on the photomask onto a photoresist film deposited over the wafer by using an exposure apparatus. A development process is then applied to the photoresist film to form photoresist patterns on the wafer.

However, when the wafer is exposed during the photolithography process, light intensity which directly comes from an exposure light source can be different from light intensity projected on the wafer after the light passes through the photomask. For example, although the distribution of light intensity is uniform before the light emitted from the exposure light source passes through the photomask, the projected light intensity passing through the photomask is not uniform because of various optical phenomena of light passing through the photomask. Since the uniformity of light intensity is different at different positions of the photomask, line widths (CD) of the patterns formed on the wafer can be differently formed.

Also, the uniformity of the line widths of the patterns formed on the photomask affects the uniformity of circuit patterns formed on the wafer. Thus, the uniformity of the patterns of the photomask is very important. For example, if an exposure process of the wafer is performed by using the photomask having a low pattern uniformity, the intra-field uniformity of the wafer can also be lowered by such a low pattern uniformity of the photomask. Particularly, if the line widths of the patterns within the wafer field are asymmetrically non-uniform due to the pattern uniformity of the photomask and the uniformity of an exposure slit, a problem occurs in that a non-uniformity of the line widths of the wafer patterns cannot be corrected by the current exposure apparatus. Accordingly, studies of the line width correction of the wafer patterns have been conducted in case that the line widths of the patterns within the wafer field are asymmetrically non-uniform.

SUMMARY OF THE INVENTION

In one embodiment, an exposure apparatus of a semiconductor device may include an exposure light source; an asymmetric adjustment filter for asymmetrically adjusting intensity of a light which passes through the exposure light source; a photomask for passing the light of which intensity is adjusted by the asymmetric adjustment filter; a projection lens for projecting the light passing through the photomask; and a wafer stage for mounting a wafer on which an image is formed by the light from the projection lens. The exposure apparatus of a semiconductor device may also include an ADE (automatic diffractive optical element exchanger) system for selecting an illumination mode of the light passing through the exposure light source; and a molded optical system for controlling a light shape of the illumination mode selected by the ADE system. Preferably, a plurality of diffractive optical elements are rotatably mounted on a revolver in the ADE system. The asymmetric adjustment filter preferably includes a scan slit which horizontally moves on the asymmetric adjustment filter. Preferably, the scan slit of the asymmetric adjustment filter makes the light transmitted adjustment filter to a predetermined region of the photomask or the wafer and the wafer stage is made to horizontally move only in one direction. The exposure apparatus of a semiconductor device may also include a symmetric adjustment filter at a lower part of the asymmetric adjustment filter to symmetrically adjust the intensity of the passing light.

DETAILED DESCRIPTION OF THE PREFERRED EMBODIMENTS

Hereinafter, the present invention will be described in detail through embodiments. The embodiments are just for exemplifying the present invention, and the scope of right to be protected of the present invention is not limited by them.

Figure 1:
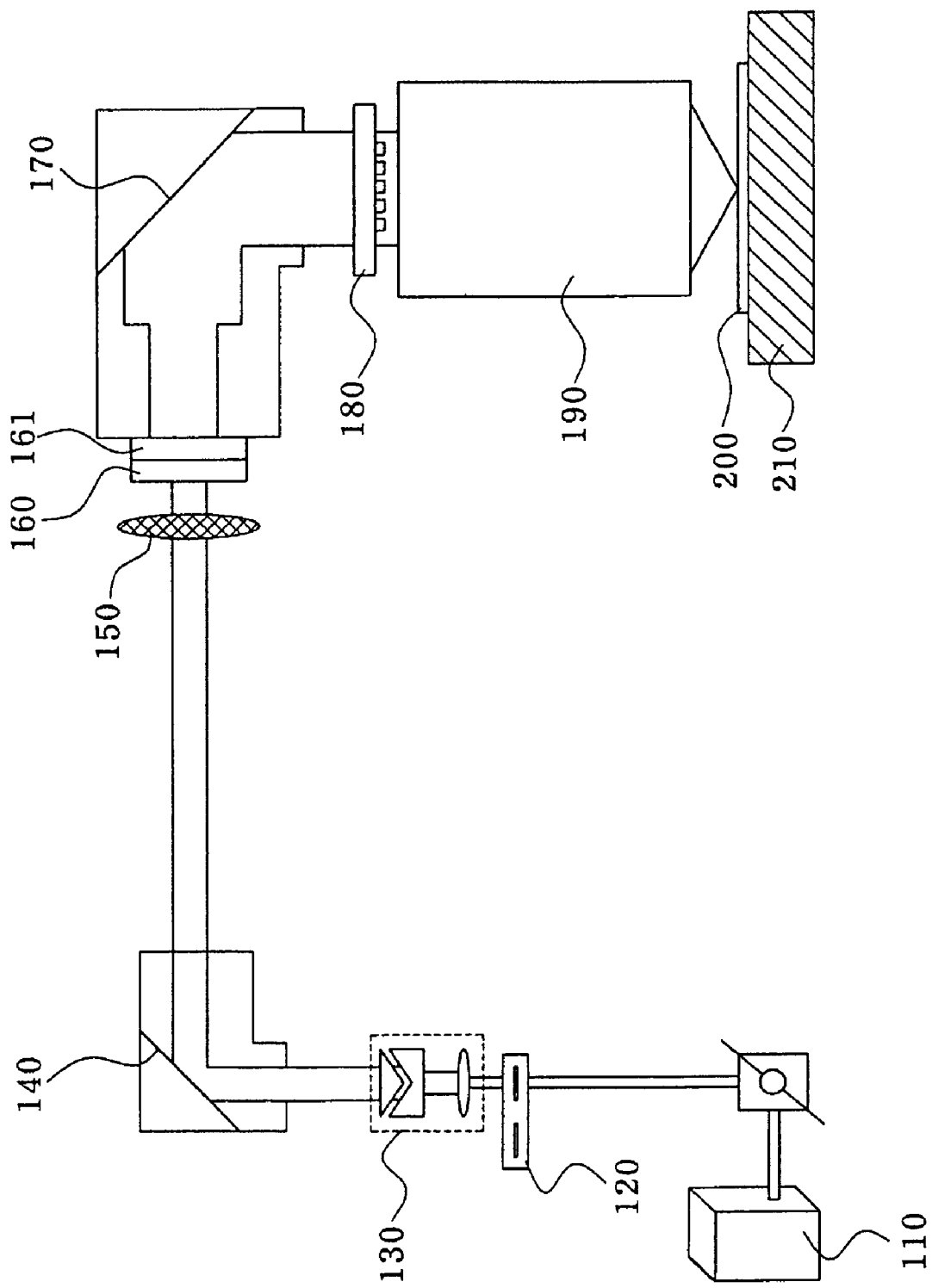
FIG. 1 is a schematic diagram illustrating an exposure apparatus according to one embodiment of the present invention.

Referring to FIG. 1, a scanner exposure apparatus according to one embodiment of the present invention includes an exposure light source 110; a reticle edge masking assembly (REMA) lens 150 for condensing a light passing through the exposure light source 110; an asymmetric adjustment filter 160 for adjusting the intensity of the light which passes through the REMA lens 150 by positions of a photomask; a photomask 180 having patterns to be projected and passing through the light of which intensity is changed by the asymmetric adjustment filter 160; a projection lens 190 for projecting the light passing through the photomask 180; and a wafer 200 on which an image is formed by the light from the projection lens 190.

The exposure light source 110, for example, provides a light to the photomask 180 by using a laser such as krypton-fluoride (KrF) or argon-fluoride (ArF). At this time, an ADE (automatic diffractive optical element exchanger) system 120 may select an illumination mode of the light of the exposure light source 110. A molded optical system 130 may control a light shape according to a condition of the illumination mode selected by the ADE system 120 if included. In the ADE system 120, a plurality of diffractive optical elements (DOEs) are rotatably mounted on a revolver to provide different illumination modes.

The light controlled by the molded optical system 130 passes through the REMA lens 150. In the asymmetric adjustment filter 160, a contrast of the filter is asymmetrically made so that the intensity of the light passing through the REMA lens 150 is asymmetrically adjusted. The asymmetric adjustment filter 160 includes a scan slit 160a in order to make the incident light transmitted only to a predetermined region of the photomask or the wafer. Thus, the line widths of patterns formed on the wafer can be corrected through the control of the intensity of the light transmitted to the asymmetric adjustment filter 160, for example, an exposure dose by positions of the photomask or the wafer. Meanwhile, a symmetric adjustment filter 161 may be included in a lower part of the asymmetric adjustment filter 160 to symmetrically control the intensity of the light passing through the REMA lens 150, and the contrast of the symmetric adjustment filter 161 may be symmetrically made.

The photomask 180 has the same patterns as those to be projected onto the wafer 200. The wafer 200 is mounted on a wafer stage 210. In the illustrated example, a photoresist film is formed on the wafer 200 so that the patterns disposed on the photomask 180 are projected onto the photoresist film by an exposure process. The wafer stage 210 may be limited in its motion for example to a single direction within a plane and as illustrated, preferably limited to move horizontally in one direction during the exposure process.

During the exposure procedure of the scanner exposure apparatus, the light provided from the exposure light source 110 passes through the ADE system 120 so that a desired illumination mode is obtained. The light then passes through the molded optical system 130, if provided. The light passing through the molded optical system 130 is reflected by a first reflecting mirror 140 and then passes through the REMA lens 150. The light passing through the REMA lens 150 is transmitted to the asymmetric adjustment filter 160.

Figure 2:
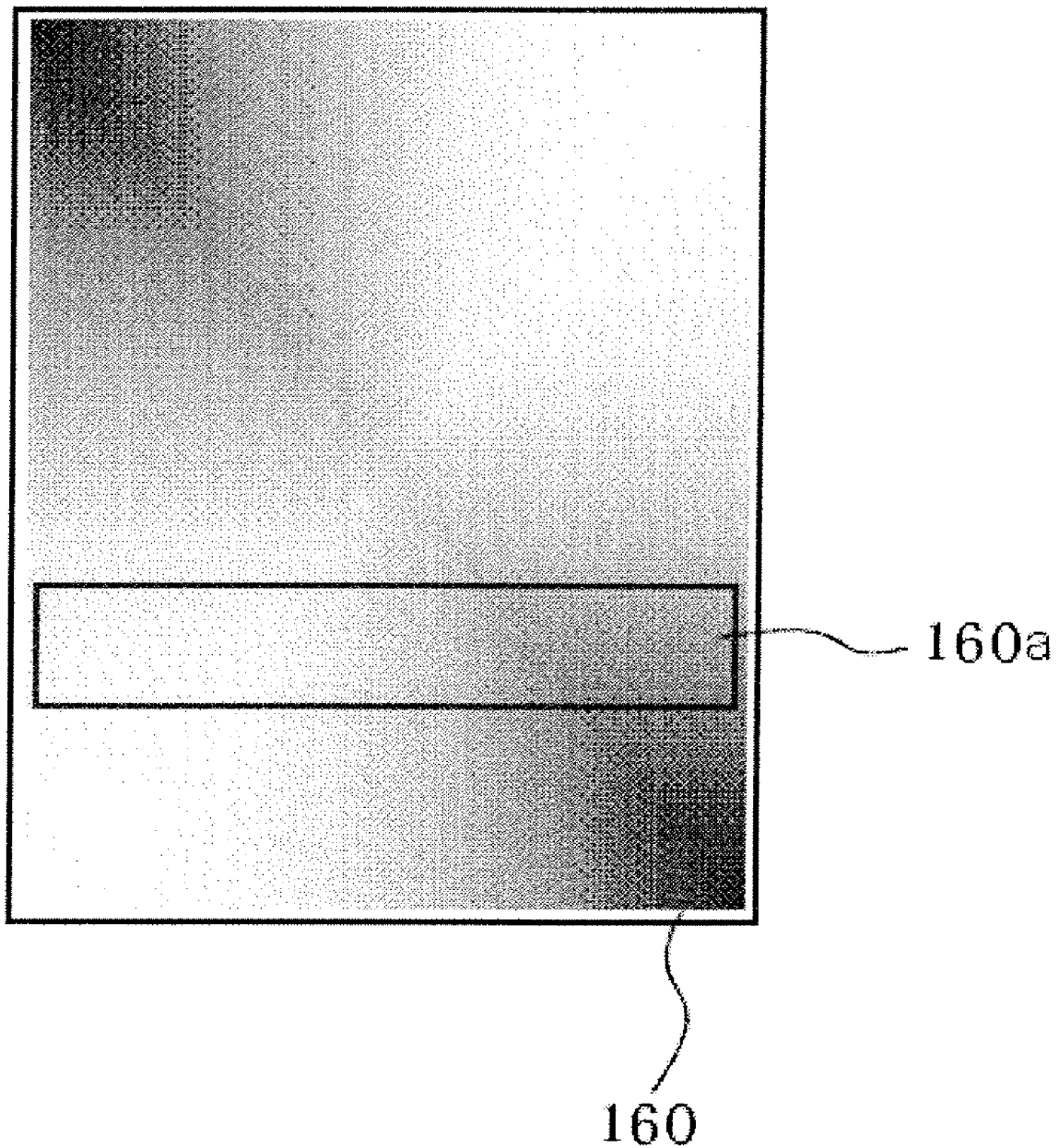
FIGS. 2 to 5 are views illustrating the exposure apparatus of FIG. 1.
Figure 3:
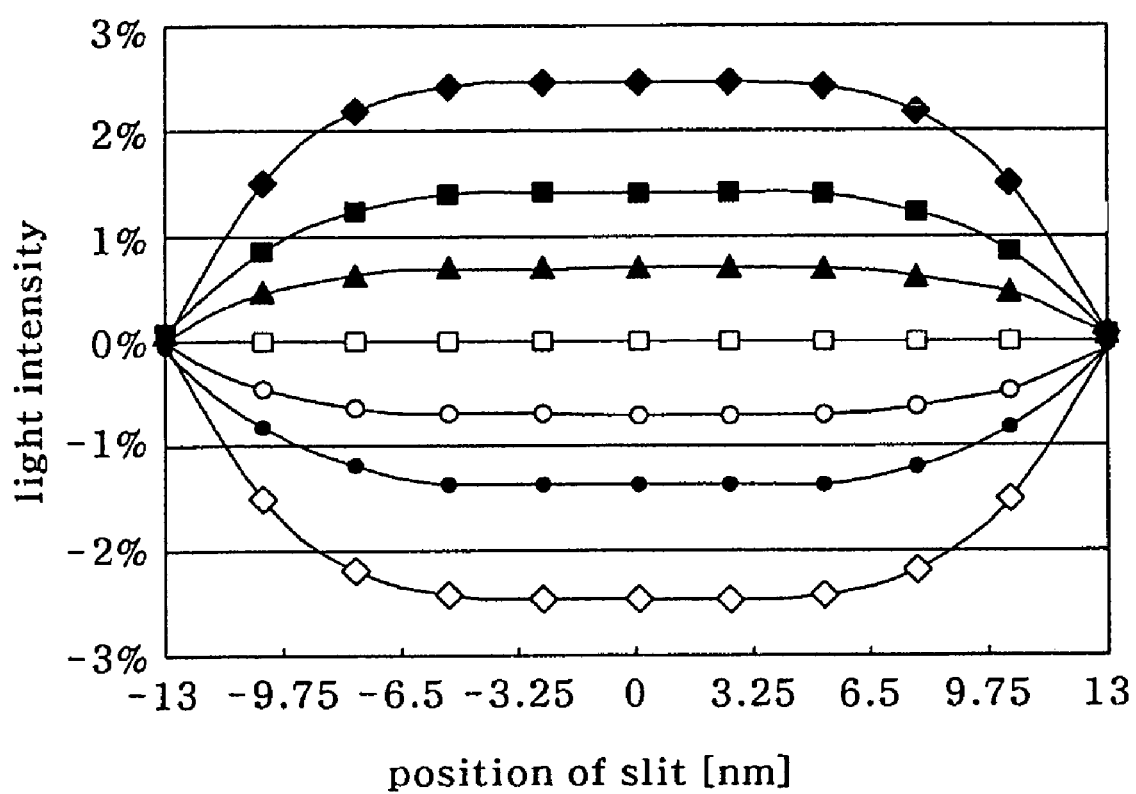

As illustrated in FIG. 2, the contrast profile of the filter is asymmetrically made by the asymmetric adjustment filter 160 so that the light intensity on the right side is different from that on the left side after the light passes through the asymmetric adjustment filter 160. Here, the asymmetric adjustment filter 160 includes the scan slit 160a to limit the transmission of light to a desired region of the photomark or the wafer, and for example, to limit the light transmitted only to the predetermined region of the photomask or the wafer. The scan slit 160a may have a size of approximately 13×26 square nanometers ($nm^2$) and the step-and-repeat projections are performed by field regions of the wafer 200. As illustrated in FIG. 3, upon measuring the light intensity according to the position of the scan slit 160a included in the asymmetric adjustment filter 160, different light intensities are transmitted according to the position so that different exposure doses are provided to the photomask.

Meanwhile, if information on the line widths of the photomask or wafer patterns is inputted in a data analysis unit of the exposure apparatus before the scan slit 160a performs the exposure process, the data analysis unit may analyze the information and appropriately position the scan slit 160a on the asymmetric adjustment filter 160.

For example, first regions having a wide line width and second regions having a narrow line width can be asymmetrically arranged by field regions of the wafer due to the several reasons during the fabrication of the photomask. At this time, the light transmitted from the REMA lens 150 passes the asymmetric adjustment filter 160 so that the light is adjusted asymmetrically based on the contrast profile of the filter and then passes through the photomask ISO.

Figure 4:
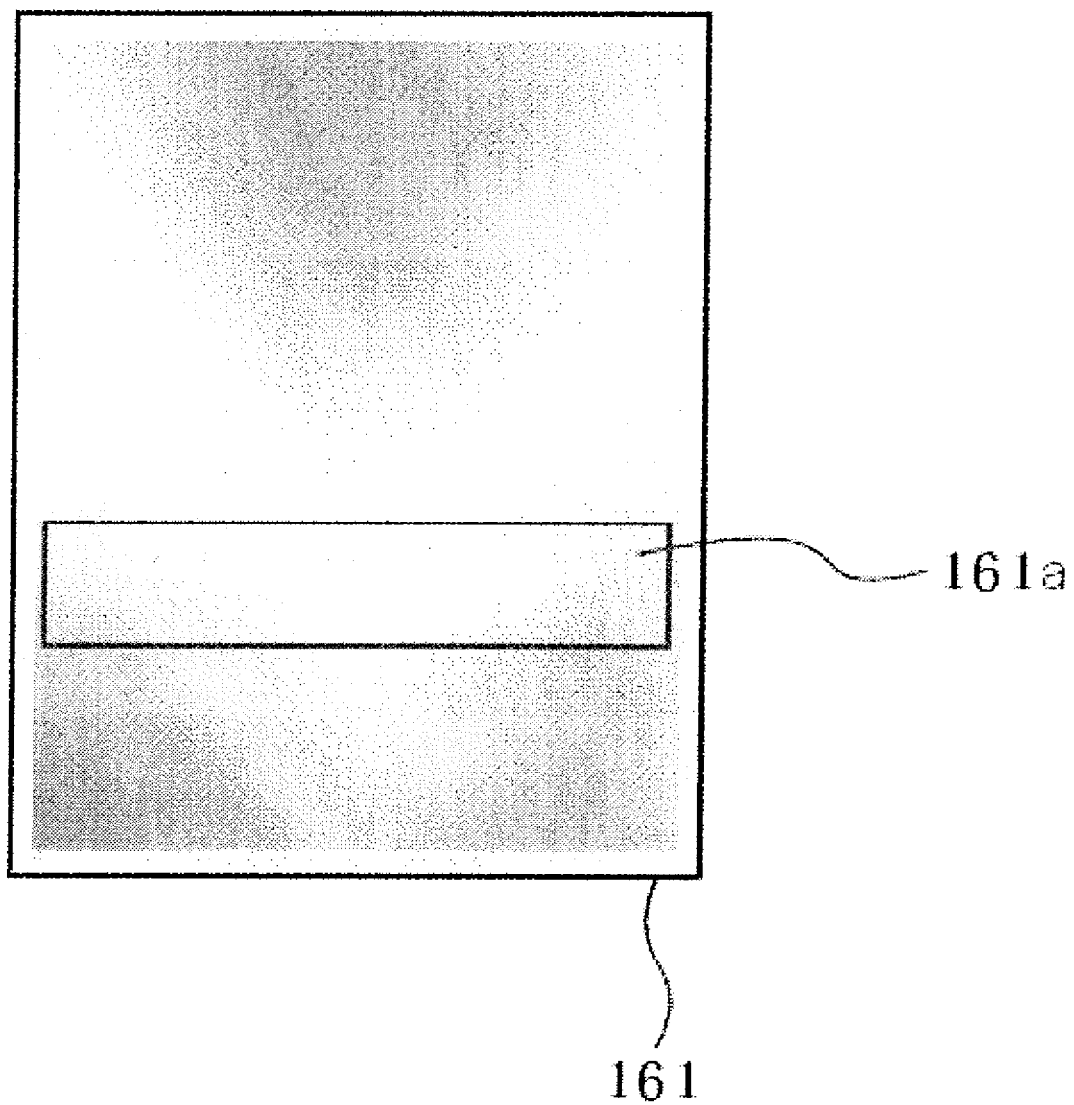
Figure 5:
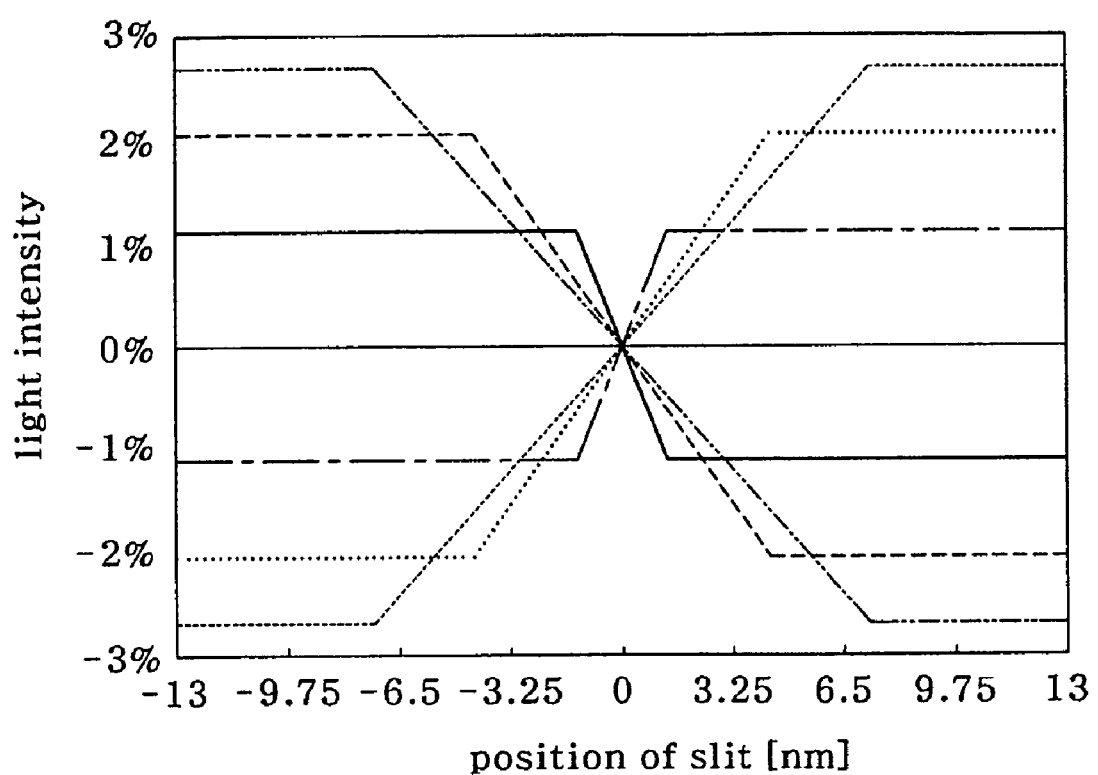

The symmetric adjustment filter 161 may be included at the lower part of the asymmetric adjustment filter 160. If the line widths of the patterns implemented on the photomask are symmetrical by field regions of the wafer, the line widths of the patterns can be corrected by the contrast profile of the symmetric adjustment filter 161. For example, as illustrated in FIG. 4, the light transmitted from the REMA lens 150 passes through the symmetric adjustment filter 161 so that the light is adjusted symmetrically based on the contrast profile of the filter and then it passes through the photomask 180. Here, the symmetric adjustment filter 161 also includes a scan slit 161a to make the exposure light pass only to a predetermined region of the photomask or the wafer. The scan slit 161a included in the symmetric adjustment filter 161 also has a size of approximately 13×26 $nm^2$. Also, as illustrated in FIG. 5, upon measuring the light intensity according to the position of the scan slit 161a, different light intensities are transmitted according to the position.

The scan slit 160a included in the asymmetric adjustment filter 160 and the scan slit 161a included in the symmetric adjustment filter 161 can be arranged at the same position. Thus, regarding the light passing through the asymmetric adjustment filter 160 and the symmetric adjustment filter 161, it is possible to change the exposure dose in the photomask 180 by positions of the scan slit based on the contrast profile of the filter. That is, regions which have line widths to be corrected wider are exposed with a high exposure dose and patterned to have the line widths wider than the line width (CD) of the wafer patterns, and regions which have line widths to be corrected narrower are exposed with a low exposure dose and patterned to have the line widths narrower than the line width (CD) of the wafer patterns when the light passes through the asymmetric adjustment filter 160 and the symmetric adjustment filter 161. The light with its intensity adjusted by the asymmetric adjustment filter 160 is reflected by a second reflecting mirror 170 and then passes through the photomask 180. Even though the line widths of the patterns on the photomask 180 may be non-uniform, the light intensity, for example, the exposure doses become different according to the patterns formed on the photomask 180 based on the contrast profile of the asymmetric adjustment filter 160. After the light passes through the projection lens 190, it is projected onto the photoresist film of the wafer 200 so that photoresist patterns are formed. Such an exposure process can be repetitively carried out until the entire region of the wafer 200 is exposed on the wafer stage 210 which horizontally moves with a constant speed rate.

The exposure apparatus according to one embodiment of the present invention can correct the asymmetrically non-uniform pattern line widths within the wafer field by fabricating and mounting the asymmetric adjustment filter that asymmetrically adjusts the profile of the light from the REMA lens. That is, the asymmetric adjustment filter changes the exposure dose in the scan slit of the asymmetric adjustment filter according to positions within the semiconductor field. As a result, the uniformity within the wafer field can be improved by exposing the wafer with an optimal exposure energy at desired positions within the semiconductor field. Although the asymmetric adjustment filter is illustrated between the REMA lens and the photomask as an example, it can be positioned anywhere else. Also, the constitution of the exposure apparatus illustrated in FIG. 1 is just an example. Thus, the present invention is not limited to the exposure apparatus having the same constitution as the constitution in FIG. 1 and can be utilized regardless of an arrangement order of the components of the apparatus. That is, the present invention can be utilized regardless of a difference in constitutions of the exposure apparatus or a difference in exposure methods such as an aligner, a stepper and a scanner.

While the present invention has been described with respect to the particular embodiments, it will be apparent to those skilled in the art that various changes and modifications may be made without departing from the spirit and scope of the invention as defined in the following claims.

What is claimed is:

1. An exposure apparatus of a semiconductor device, comprising:
   an exposure light source;
   an asymmetric adjustment filter coupled to the exposure light source and having an asymmetrically adjusted intensity light output;

a photomask coupled to the asymmetric adjustment filter and passing the asymmetrically adjusted intensity light output;

a projection lens coupled to the photomask and projecting the photomask output;

a wafer stage including a wafer mounting to mount and retain a wafer on which an image is formed by the light projected from the projection lens, and wherein the asymmetric adjustment filter has a brightness profile that causes brightness to gradually increase from a first position to a second position and brightness to gradually decrease from a third position to the first position and brightness to gradually decrease from a center of the asymmetric adjustment filter to the first position and brightness to gradually increase from the center of the asymmetric adjustment filter to the second position and the third position, wherein the direction of the first position to the second position and the direction of the third position to the first position are substantially perpendicular to each other.

2. The exposure apparatus of claim 1, further comprising:
an ADE (automatic diffractive optical element exchanger) system coupled to the exposure light source to select an illumination mode of the exposure light source; and
a molded optical system coupled to the exposure light source to control a light shape of the illumination mode.

3. The exposure apparatus of claim 2, the ADE comprising a plurality of selectable diffractive optical elements.

4. The exposure apparatus of claim 3, wherein the plurality of selectable diffractive optical elements are rotatably mounted on a revolver in the ADE system.

5. The exposure apparatus of claim 1, wherein the asymmetric adjustment filter includes a scan slit which moves within a plane on the asymmetric adjustment filter.

6. The exposure apparatus of claim 5, the plane being parallel to the light transmitting surface of filters.

7. The exposure apparatus of claim 5, the light output of the asymmetric adjustment filter is restricted to a predetermined region of the photomask or the wafer by the scan slit.

8. The exposure apparatus of claim 1, wherein the wafer stage is made to move within a plane only in one direction.

9. The exposure apparatus of claim 8, the plane being horizontal.

10. The exposure apparatus of claim 1, further comprising a symmetric adjustment filter at a position downstream of the asymmetric adjustment filter with respect to a direction of propagation of the light to symmetrically adjust the intensity of the light whose intensity is adjusted by the asymmetric adjustment filter.

11. The exposure apparatus of claim 1, wherein the second direction is substantially opposite to the first direction and the fourth direction is substantially opposite to the third direction.

12. The exposure apparatus of claim 11, wherein the first direction and the third direction are substantially perpendicular to each other.

13. An exposure apparatus of a semiconductor device, comprising:
an exposure light source;
an asymmetric adjustment filter for asymmetrically adjusting the intensity of a light which passes through the exposure light source;
a symmetric adjustment filter positioned at a position downstream of the asymmetric adjustment filter with respect to a direction of propagation of the light to symmetrically adjust the intensity of the light whose intensity is adjusted by the asymmetric adjustment filter;
a photomask for passing the light of which intensity is adjusted by the asymmetric adjustment filter and the symmetric adjustment filter;
a projection lens for projecting the light passing through the photomask; and
a wafer stage for mounting a wafer on which an image is formed by the light from the projection lens,
wherein the asymmetric adjustment filter has a brightness profile that causes brightness to gradually increase from a first position to a second position and brightness to gradually decrease from a third position to the first position and brightness to gradually decrease from a center of the asymmetric adjustment filter to the first position and brightness to gradually increase from the center of the asymmetric adjustment filter to the second position and the third position, wherein the direction of the first position to the second position and the direction of the third position to the first position are substantially perpendicular with each other.

14. The exposure apparatus of claim 13, further comprising:
an ADE (automatic diffractive optical element exchanger) system for selecting an illumination mode of the light passing through the exposure light source; and
a molded optical system for controlling a light shape of the illumination mode selected by the ADE system.

15. The exposure apparatus of claim 14, wherein a plurality of diffractive optical elements are rotatably mounted on a revolver in the ADE system.

16. The exposure apparatus of claim 13, wherein the asymmetric adjustment filter includes a first scan slit which moves on the asymmetric adjustment filter parallel to the light transmitting surface of the asymmetric adjustment filter, and the symmetric adjustment filter includes a second scan slit which moves on the symmetric adjustment filter parallel to the light transmitting surface of the symmetric adjustment filter.

17. The exposure apparatus of claim 16, wherein the first scan slit of the asymmetric adjustment filter makes the light which is transmitted to the asymmetric adjustment filter incident on a predetermined region of the photomask or the wafer.

18. The exposure apparatus of claim 16, wherein the second scan slit of the symmetric adjustment filter makes the light which is transmitted to the symmetric adjustment filter incident on a predetermined region of the photomask or the wafer.

19. The exposure apparatus of claim 13, wherein the second direction is substantially opposite to the first direction and the fourth direction is substantially opposite to the third direction.

20. The exposure apparatus of claim 19, wherein the first direction and the third direction are substantially perpendicular to each other.

* * * * *